United States Patent
Oh et al.

(10) Patent No.: US 11,183,246 B1
(45) Date of Patent: Nov. 23, 2021

(54) MEMORY DEVICE

(71) Applicant: SK hynix Inc., Icheon-si (KR)

(72) Inventors: Sung Lae Oh, Icheon-si (KR); Won Seok Kim, Icheon-si (KR); Sang Woo Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/015,375

(22) Filed: Sep. 9, 2020

(30) Foreign Application Priority Data

May 25, 2020 (KR) .................. 10-2020-0062257

(51) Int. Cl.
| | | |
|---|---|---|
| *G11C 16/08* | (2006.01) | |
| *H01L 25/18* | (2006.01) | |
| *H01L 23/00* | (2006.01) | |
| *G11C 16/14* | (2006.01) | |
| *G11C 16/24* | (2006.01) | |
| *G11C 16/04* | (2006.01) | |

(52) U.S. Cl.
CPC .............. *G11C 16/08* (2013.01); *G11C 16/14* (2013.01); *G11C 16/24* (2013.01); *H01L 24/08* (2013.01); *H01L 25/18* (2013.01); *G11C 16/0483* (2013.01); *H01L 2224/08145* (2013.01); *H01L 2924/1431* (2013.01); *H01L 2924/14511* (2013.01)

(58) Field of Classification Search
None
See application file for complete search history.

(56) References Cited

U.S. PATENT DOCUMENTS

| | | | | |
|---|---|---|---|---|
| 8,922,243 | B2 * | 12/2014 | Jayasena | G06F 13/4234 326/39 |
| 2010/0195364 | A1 * | 8/2010 | Riho | H01L 23/60 365/63 |
| 2015/0016172 | A1 * | 1/2015 | Loh | G11C 5/02 365/51 |
| 2016/0118399 | A1 * | 4/2016 | Son | H01L 27/11526 365/185.18 |
| 2016/0196863 | A1 * | 7/2016 | Shin | G11C 11/40622 365/222 |

FOREIGN PATENT DOCUMENTS

| | | |
|---|---|---|
| JP | 2018-163970 A | 10/2018 |
| KR | 10-2016-0069584 A | 6/2016 |
| KR | 10-2021-0091457 A | 7/2021 |

* cited by examiner

*Primary Examiner* — Tan T. Nguyen

(57) ABSTRACT

A memory device includes a first plane defined in a second wafer stacked on a first wafer; a second plane defined in a third wafer stacked on the second wafer, and overlapping with the first plane in a vertical direction; a first page buffer circuit including a first column driver coupled to bit lines of the first plane and a first column operator; and a second page buffer circuit including a second column driver coupled to bit lines of the second plane and a second column operator. The first column driver is disposed in the second wafer, the second column driver is disposed in the third wafer and overlaps with the first column driver in the vertical direction, and the first and second column operators are disposed in a cell region of the first wafer and overlap with the first and second planes in the vertical direction.

20 Claims, 12 Drawing Sheets

MEMORY DEVICE

CROSS-REFERENCE TO RELATED APPLICATION

The present application claims priority under 35 U.S.C. § 119(a) to Korean Patent Application No. 10-2020-0062257 filed in the Korean Intellectual Property Office on May 25, 2020, which is incorporated herein by reference in its entirety.

BACKGROUND

1. Technical Field

Various embodiments generally relate to a semiconductor technology, and more particularly, to a memory device.

2. Related Art

With the development of semiconductor manufacturing technology, the demand for high-performance memory is increasing, and various methods have been proposed to meet the demand. A multi-plane structure has been proposed as one of these methods. In a memory device having a multi-plane structure, memory blocks are distributed over a plurality of planes, and a command may be executed simultaneously on memory blocks of different planes.

SUMMARY

Various embodiments are directed to suggesting measures capable of increasing the number of planes to be disposed within a limited layout.

In an embodiment, a memory device may include: a first plane including a plurality of memory cells that are defined in a second wafer stacked on a first wafer; a second plane including a plurality of memory cells that are defined in a third wafer stacked on the second wafer, and overlapping with the first plane in a vertical direction; a first page buffer circuit including a first column driver, which is coupled to bit lines of the first plane, and a first column operator that is coupled to the first column driver; and a second page buffer circuit including a second column driver, which is coupled to bit lines of the second plane, and a second column operator that is coupled to the second column driver. The first column driver may be disposed in the second wafer, the second column driver may be disposed in the third wafer and may overlap with the first column driver in the vertical direction, and the first and second column operators may be disposed in a cell region of the first wafer and overlap with the first and second planes in the vertical direction.

In an embodiment, a memory device may include: a plane including a first sub plane that is defined in a second wafer stacked on a first wafer, and a second sub plane that is defined in a third wafer stacked on the second wafer; and a page buffer circuit including a first sub column driver that is coupled to bit lines of the first sub plane, a second sub column driver that is coupled to bit lines of the second sub plane, and a column operator that is coupled to the first and second sub column drivers. The first sub column driver may be disposed in the second wafer, the second sub column driver may be disposed in the third wafer and may overlap with the first sub column driver in a vertical direction, and the column operator may be disposed in a cell region of the first wafer and overlaps with the first and second sub planes in the vertical direction.

In an embodiment, a memory device may include: a first memory cell array disposed in a second wafer stacked on a first wafer; a second memory cell array disposed in a third wafer stacked on the second wafer, and overlapping with the first memory cell array in a vertical direction; a first access circuit including a first high-voltage circuit that interoperates with the first memory cell array and a first low-voltage circuit that interoperates with the first memory cell array through the first high-voltage circuit; and a second access circuit including a second high-voltage circuit that interoperates with the second memory cell array and a second low-voltage circuit that interoperates with the second memory cell array through the second high-voltage circuit. The first high-voltage circuit may be disposed in the second wafer, the second high-voltage circuit may be disposed in the third wafer and may overlap with the first high-voltage circuit in the vertical direction, and the first and second low-voltage circuits may be disposed in the first wafer.

In an embodiment, a memory device may include: a first wafer, a second wafer and a third wafer bonded to each other in a vertical direction. The second wafer may include a plurality of first memory cells and a first page buffer high-voltage circuit that controls the plurality of first memory cells. The third wafer may include a plurality of second memory cells and a second page buffer high-voltage circuit that controls the plurality of second memory cells. The first wafer may include a page buffer low-voltage circuit that interoperates in common with the first and second page buffer high-voltage circuits and exchanges data with the plurality of first memory cells and the plurality of second memory cells through the first and second page buffer high-voltage circuits.

DETAILED DESCRIPTION

Figure 1:
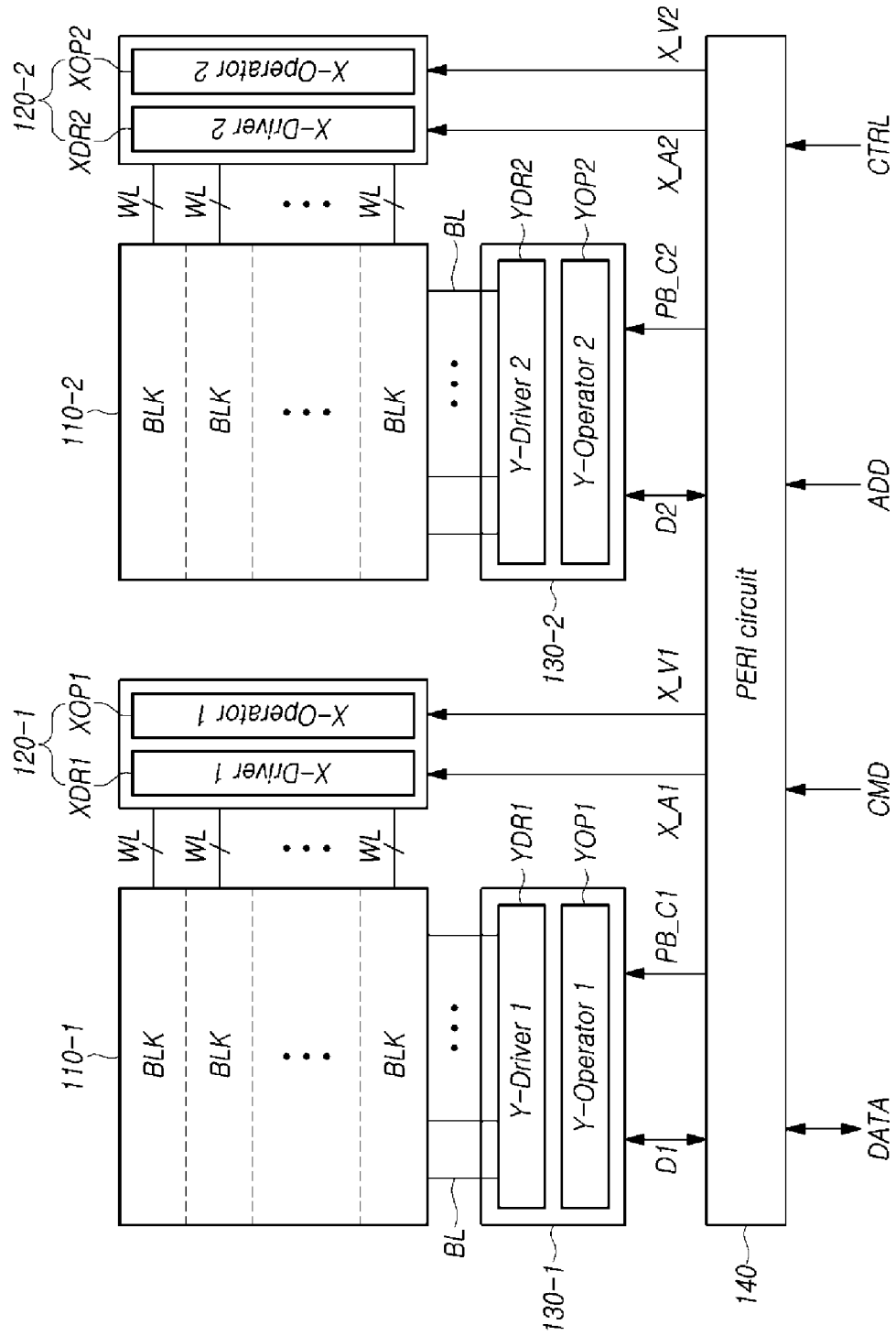
FIG. 1 is a block diagram illustrating a representation of a memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various ways. The exemplary embodiments of the present disclosure convey the scope of the disclosure to those skilled in the art.

The figures, dimensions, ratios, angles, numbers of elements given in the drawings that describe embodiments of the disclosure are merely illustrative, and so the present disclosure is not limited to the illustrated matters. Throughout the specification, like reference numerals refer to like components. In describing the disclosure, when it is determined that a detailed description of the related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article, e.g., "a," "an" or "the," is used when referring to a singular noun, this may include a plural of that noun unless specifically stated otherwise. Components in embodiments of the disclosure should be interpreted as including error margins even in the absence of explicit statements.

Also, in describing the components of the disclosure, there may be used terms such as first, second, A, B, (a), and (b). These are solely for the purpose of differentiating one component from another component and do not limit the substances, order, sequence or number of the components. Also, components in embodiments of the disclosure are not limited by these terms. These terms are used to merely distinguish one component from another component. Accordingly, as used herein, a first component may be a second component within the technical spirit of the disclosure.

If a component is described as "connected," "coupled" or "linked" to another component, it should be understood that the component may be directly "connected," "coupled" or "linked" to the another embodiment but still another component may be "interposed" therebetween or the component may be "connected," "coupled" or "linked" to the another component via a still another component. In describing positional relationship, such as "an element A on an element B," "an element A above an element B," "an element A below an element B" and "an element A next to an element B," another element C may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

In the following descriptions, a direction in which wafers are stacked is defined as a vertical direction VD, an extending direction of bit lines is defined as a first direction FD, and an arrangement direction of the bit lines is defined as a second direction SD. The first direction FD and the second direction SD may be parallel to a plane orthogonal to the vertical direction VD, and may intersect with each other. The first direction FD and the second direction SD may substantially perpendicularly intersect with each other. In the following descriptions, the term 'vertical' or 'vertical direction' will be used as substantially the same meaning as the vertical direction VD. In the drawings, a direction indicated by an arrow and a direction opposite thereto represent the same direction.

Hereinafter, various examples of embodiments of the disclosure will be described in detail with reference to the accompanying drawings.

FIG. 1 is a block diagram illustrating a representation of a memory device in accordance with an embodiment of the disclosure.

Referring to FIG. 1, the memory device may include a plurality of planes 110-1 and 110-2 and a logic circuit for controlling operations of the plurality of planes 110-1 and 110-2. The logic circuit may include a plurality of row decoders 120-1 and 120-2, a plurality of page buffer circuits 130-1 and 130-2, and a peripheral circuit 140.

The plurality of planes 110-1 and 110-2 may include a first plane 110-1 and a second plane 110-2. Each of the first plane 110-1 and the second plane 110-2 may include a plurality of memory blocks BLK. Each memory block BLK may include a plurality of memory cells each having a state corresponding to data stored therein. Each memory cell may be a volatile memory cell, which loses data stored therein if the power supply is interrupted, or may be a nonvolatile memory cell, which retains data stored therein even though the power supply is interrupted. While it is described below that the memory device is a vertical NAND flash device, it is to be understood that the technical idea of the disclosure is not limited thereto. Although the present embodiment includes two planes, the disclosure is not limited thereto. The number of planes may be three or more.

Each of the row decoders 120-1 and 120-2 may be coupled to a corresponding plane 110-1 or 110-2 through a plurality of word lines WL, which may provide access the corresponding plane 110-1 or 110-2. The row decoders 120-1 and 120-2 may be defined as a row access circuit. For instance, the row decoders 120-1 and 120-2 may include a first row decoder 120-1 that is coupled to the first plane 110-1 and a second row decoder 120-2 that is coupled to the second plane 110-2.

The first row decoder 120-1 may include a first row driver (X-Driver 1) XDR1 and a first row operator (X-Operator 1) XOP1. The first row driver XDR1 may be coupled to the word lines WL that are arranged in the first plane 110-1, and may transfer an operating voltage X_V1, inputted from the peripheral circuit 140, to word lines WL, which are coupled to a memory block BLK selected from among the memory blocks BLK of the first plane 110-1.

The first row operator XOP1 may select one from among the memory blocks BLK included in the first plane 110-1 in response to a row address X_A1 provided from the peripheral circuit 140. The first row operator XOP1 may control the first row driver XDR1 to transfer the operating voltage X_V1, provided from the peripheral circuit 140, to the word lines WL of the selected memory block BLK.

The second row decoder 120-2 may include a second row driver (X-Driver 2) XDR2 and a second row operator (X-Operator 2) XOP2. The second row driver XDR2 may be configured and operate in a manner similar to the first row driver XDR1. The second row operator XOP2 may be configured and operate in a manner similar to the first row operator XOP1.

Each of the operating voltages X_V1 and X_V2 may include a program voltage, a pass voltage, an unselected read voltage, a read voltage, a verify voltage or the like. The unselected read voltage represents a voltage that is provided to an unselected word line in a read operation, and the read voltage represents a voltage that is provided to a selected word line in the read operation. The program voltage, the pass voltage or the read voltage may correspond to a high voltage. In this specification, a boosted voltage higher than a power supply voltage will be defined as a high voltage, and a voltage lower than the power supply voltage will be defined as a low voltage.

Transistors that are included in the first and second row drivers XDR1 and XDR2 may be configured by high-voltage transistors to withstand a high voltage. On the other hand, transistors which are included in the first and second row operators XOP1 and XOP2 may be configured by low-voltage transistors.

Each of the page buffer circuits 130-1 and 130-2 may be coupled to a corresponding plane 110-1 or 110-2 through a plurality of bit lines BL, which may allow access the corresponding plane 110-1 or 110-2. The page buffer circuits 130-1 and 130-2 may be defined as a column access circuit. For instance, the page buffer circuits 130-1 and 130-2 may include a first page buffer circuit 130-1 that is coupled to the first plane 110-1 and a second page buffer circuit 130-2 that is coupled to the second plane 110-2.

The first page buffer circuit 130-1 may include a first column driver (Y-Driver 1) YDR1 and a first column operator (Y-Operator 1) YOP1. The first column driver YDR1 may be coupled to the plurality of bit lines BL that are arranged in the first plane 110-1, and may select a bit line in response to a bit line select signal.

The first column operator YOP1 may be coupled to the plurality of bit lines BL that are arranged in the first plane 110-1, through the first column driver YDR1, and may control the bit lines BL that are arranged in the first plane 110-1 in response to a first page buffer control signal PB_C1 from the peripheral circuit 140. For example, the first column operator YOP1 may detect, in response to the first page buffer control signal PB_C1, data stored in a memory cell of the first plane 110-1 by sensing the signal of a bit line BL of the first plane 110-1, and may transmit a data signal D1 to the peripheral circuit 140 depending on the detected data. The first column operator YOP1 may apply, in response to the first page buffer control signal PB_C1, a signal to a bit line BL based on the data signal D1 received from the peripheral circuit 140, and thereby, may write data in a memory cell of the first plane 110-1. The first column operator YOP1 may write or read data to or from a memory cell that is coupled to a word line activated by the first row decoder 120-1.

The second page buffer circuit 130-2 may include a second column driver (Y-Driver 2) YDR2 and a second column operator (Y-Operator 2) YOP2. The second column driver YDR2 may be configured and operate in a manner similar to the first column driver YDR1. The second column operator YOP2 may be configured and operate in a manner similar to the first column operator YOP1.

In an erase operation, a high voltage may be applied to the bit lines BL. Transistors that are included in the first column driver YDR1 and the second column driver YDR2 may be configured by high-voltage transistors to withstand a high voltage applied to the bit lines BL in the erase operation. On the other hand, transistors that are included in the first column operator YOP1 and the second column operator YOP2 may be configured by low-voltage transistors.

Although embodiments to be described with reference to the drawings in this specification illustrate that column operators are individually provided to each of the first page buffer circuit 130-1 and the second page buffer circuit 130-2, it is to be noted that the disclosure is not limited thereto.

In other embodiments, a single column operator may be provided in common to the first page buffer circuit 130-1 and the second page buffer circuit 130-2. The column operator may be coupled to both the first column driver YDR1 of the first page buffer circuit 130-1 and the second column driver YDR2 of the second page buffer circuit 130-2.

The first column driver YDR1 and the second column driver YDR2 may be independently activated. For example, if only one of the first column driver YDR1 and the second column driver YDR2 is activated, then the column operator may exchange data with one of the first plane 110-1 and the second plane 110-2 through one activated column driver. On the other hand, if the first column driver YDR1 and the second column driver YDR2 are simultaneously activated, then the column operator may exchange data in parallel with the first plane 110-1 and the second plane 110-2 through the first column driver YDR1 and the second column driver YDR2.

The peripheral circuit 140 may receive a command signal CMD, an address signal ADD and a control signal CTRL from outside the memory device, and may transmit and receive data DATA to and from a device outside the memory device, for example, a memory controller. The peripheral circuit 140 may output signals for writing data in the first and second planes 110-1 and 110-2 or reading data from the first and second planes 110-1 and 110-2, for example, the row addresses X_A1 and X_A2, the page buffer control signals PB_C1 and PB_C2 and so forth, based on the command signal CMD, the address signal ADD and the control signal CTRL. The peripheral circuit 140 may generate various voltages including the operating voltages X_V1 and X_V2, which are required in the memory device.

The operation of the first plane 110-1 and the operation of the second plane 110-2 may be controlled independently of each other. For instance, a program operation may be performed for the first plane 110-1, and a read operation may be performed for the second plane 110-2. By including the first and second planes 110-1 and 110-2, the memory device may achieve an effect similar to that achieved when two chips share an input/output bus, and accordingly, it is possible to improve the performance of a system that includes memory devices contemplated by the disclosure.

As the number of layers of memory cells increases, that is, as the number of stacks of word lines increases, the layout area occupied by an individual plane decreases. As a method for improving the performance of a system, a method of increasing the number of planes included in a memory device may be employed. However, if the number of planes increases, then the number of row decoders and the number of page buffer circuits increase in correspondence to the number of the planes, and thus layout area consumption due to the presence of the row decoders and the page buffer circuits may increase. For this reason, even though the size of a plane is reduced through process refinements and use of a three-dimensional stack structure, it is not easy to reduce the size of the memory device. The following embodiments may suggest measures capable of reducing layout area consumption through changes in the layout structures of the row decoders and the page buffer circuits.

Figure 2:
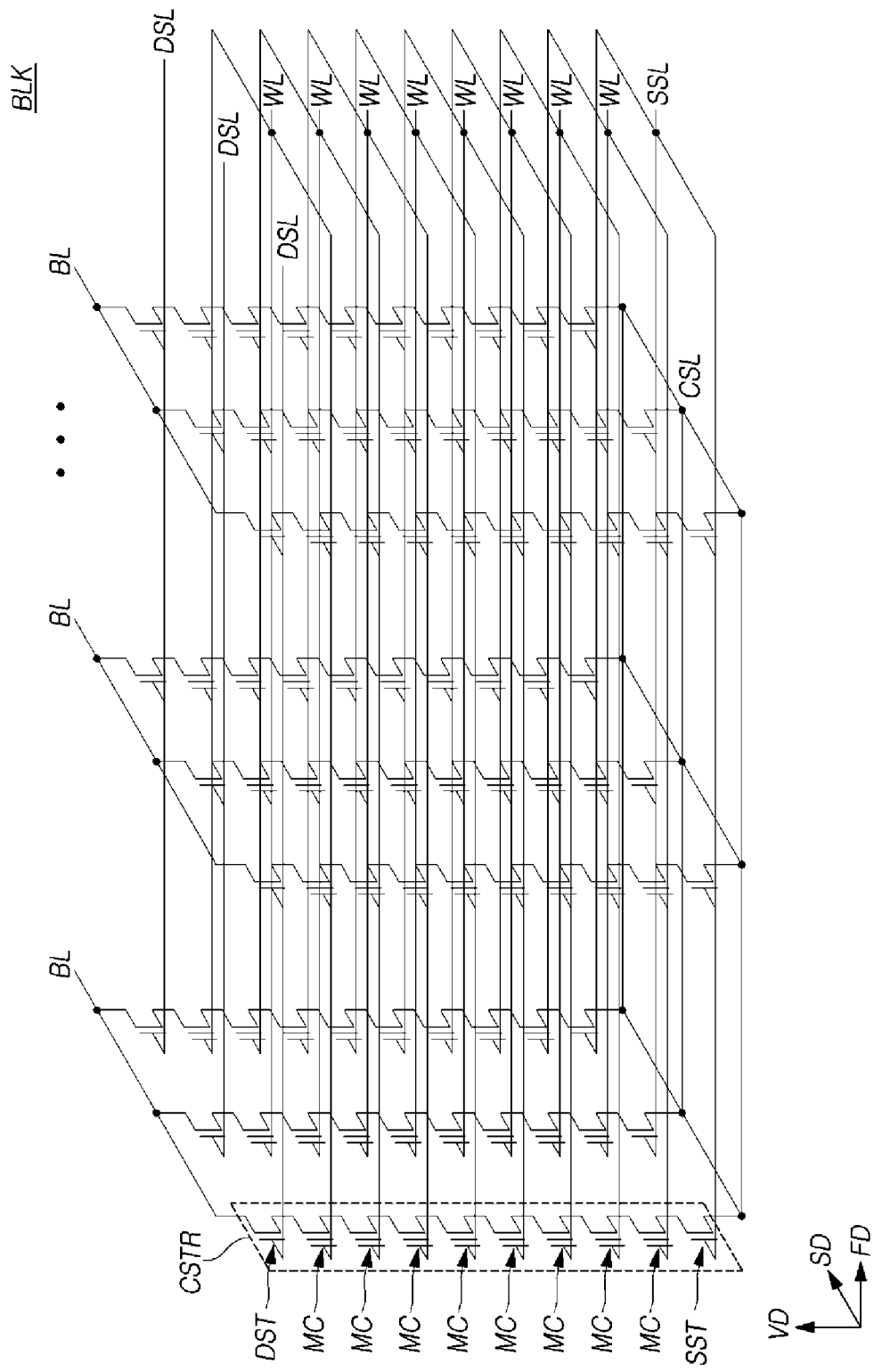
FIG. 2 is an equivalent circuit diagram illustrating a representation of a memory block illustrated in FIG. 1.

FIG. 2 is an equivalent circuit diagram illustrating a representation of a memory block BLK illustrated in FIG. 1.

Referring to FIG. 2, a memory block BLK may include a plurality of cell strings CSTR corresponding to a plurality of bit lines BL and to a common source line CSL. The bit lines BL may extend in a first direction FD and be arranged in a second direction SD. A plurality of cell strings CSTR may be coupled in parallel to each of the bit lines BL. The cell strings CSTR may be coupled in common to the common source line CSL. The plurality of cell strings CSTR may be disposed between the plurality of bit lines BL and the one common source line CSL.

Each of the cell strings CSTR may include a drain select transistor DST that is coupled to the bit line BL, a source select transistor SST that is coupled to the common source line CSL, and a plurality of memory cells MC that are coupled between the drain select transistor DST and the source select transistor SST. The drain select transistor DST, the memory cells MC and the source select transistor SST may be coupled in series in a vertical direction VD.

Drain select lines DSL, a plurality of word lines WL and a source select line SSL may be disposed between the bit lines BL and the common source line CSL in the vertical direction VD. Each of the drain select lines DSL may be coupled to the gates of corresponding drain select transistors DST. Each of the word lines WL may be coupled to the gates of corresponding memory cells MC. The source select line SSL may be coupled to the gates of source select transistors SST.

Memory cells MC included in the memory block BLK may be divided into physical page units or logical page units. For example, memory cells MC that share a word line WL and are coupled to different cell strings CSTR may configure one physical page. Such a page may be a basic unit of a read operation.

Figure 3:
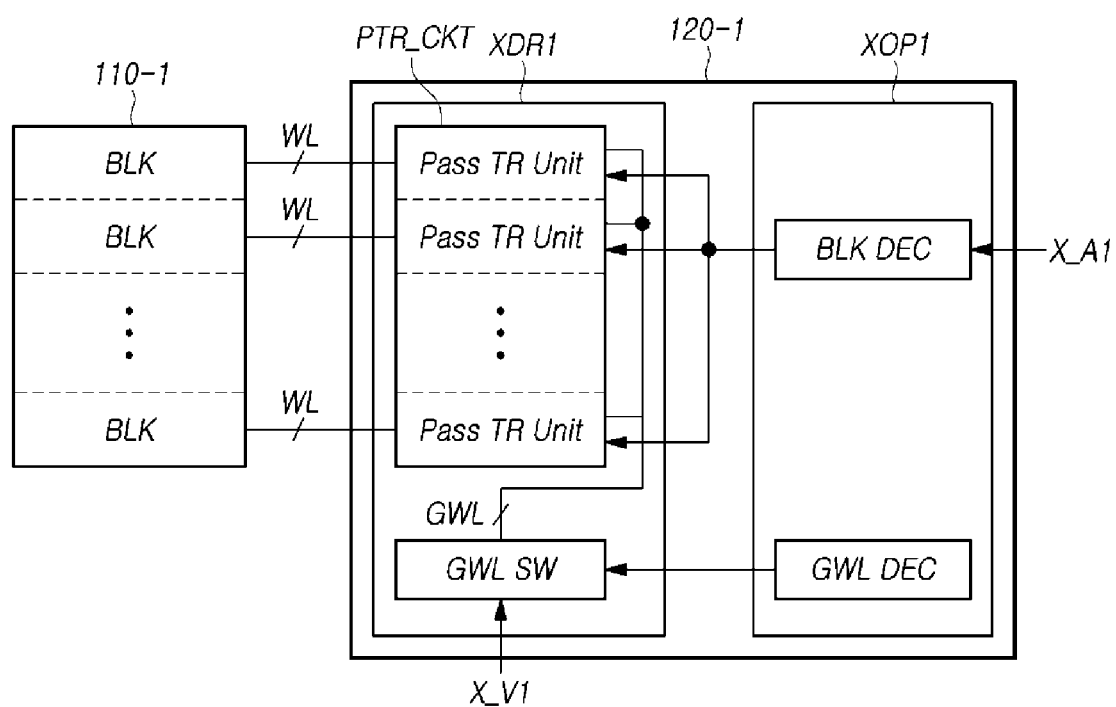
FIG. 3 is a block diagram illustrating a representation of a first row decoder illustrated in FIG. 1.

FIG. 3 is a block diagram schematically illustrating a representation of a first row decoder illustrated in FIG. 1.

Referring to FIG. 3, a first row decoder 120-1 may include a first row driver XDR1 and a first row operator XOP1. The first row driver XDR1 may include a pass transistor circuit PTR_CKT and a global line switch circuit GWL SW. The first row operator XOP1 may include a block decoder BLK DEC and a global line decoder GWL DEC.

The global line switch circuit GWL SW may include a plurality of global line switching transistors that are coupled to a plurality of global word lines GWL and that transfer the operating voltage X_V1, from the peripheral circuit 140 (see FIG. 1), to the plurality of global word lines GWL in response to a signal from the global line decoder GWL DEC. The pass transistor circuit PTR_CKT may include a plurality of pass transistor units Pass TR Unit that correspond respectively to the plurality of memory blocks BLK included in the first plane 110-1. Each pass transistor unit Pass TR Unit may include a plurality of pass transistors, which are coupled between the plurality of word lines WL coupled to a corresponding memory block BLK and the plurality of global word lines GWL.

The block decoder BLK DEC may provide a signal for selecting one of the memory blocks BLK to the pass transistor circuit PTR_CKT in response to the row address X_A1 from the peripheral circuit 140 (see FIG. 1). The pass transistor circuit PTR_CKT may couple, to the plurality of global word lines GWL, the plurality of word lines WL coupled to a memory block BLK selected in response to the signal from the block decoder BLK DEC.

Figure 4:
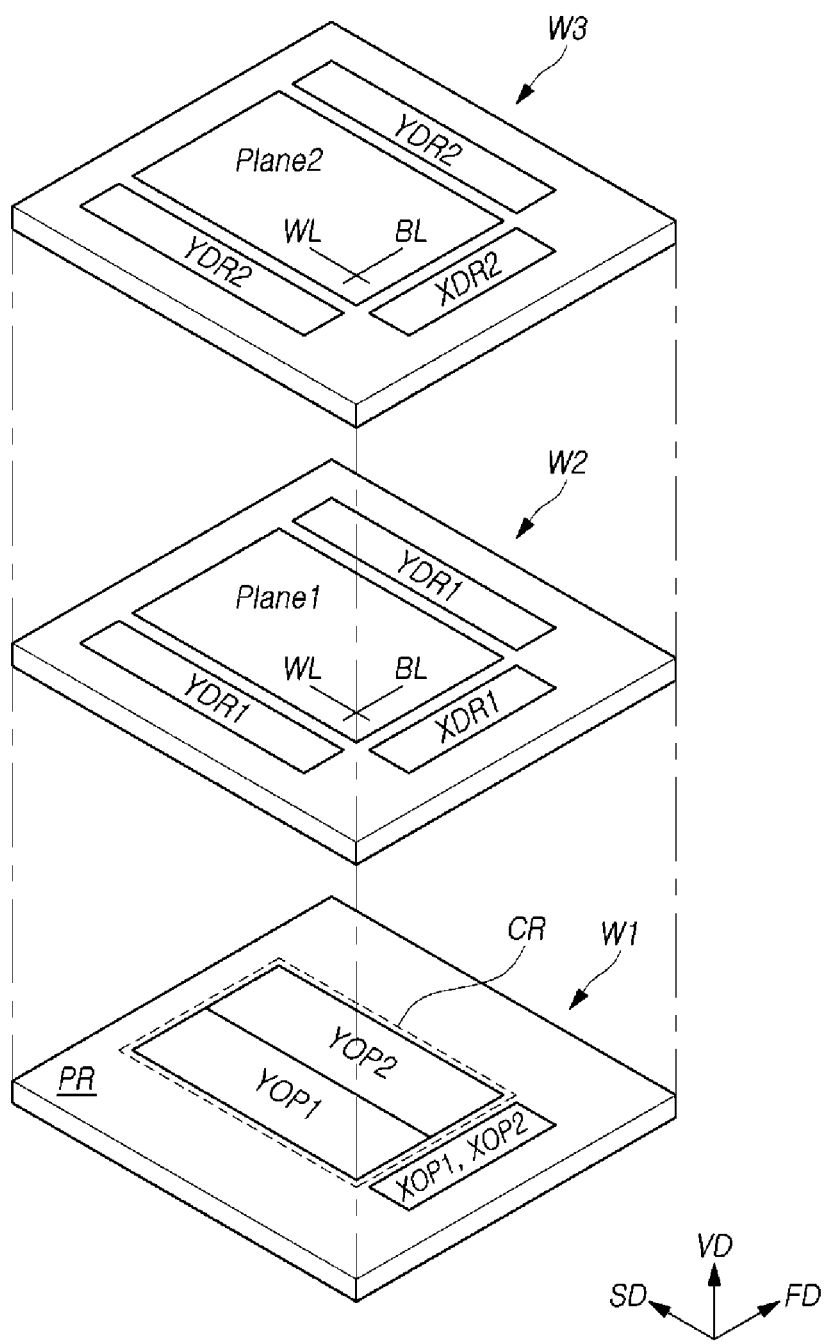
FIG. 4 is a diagram schematically illustrating a representation of a layout of a memory device in accordance with an embodiment of the disclosure.

FIG. 4 is a diagram schematically illustrating a representation of a layout of a memory device in accordance with an embodiment of the disclosure.

Referring to FIG. 4, a memory device in accordance with an embodiment of the disclosure may include first to third wafers W1 to W3, which are stacked in the vertical direction VD. For example, the second wafer W2 may be stacked on the first wafer W1, and the third wafer W3 may be stacked on the second wafer W2.

In an embodiment, the first and second row operators XOP1 and XOP2 and the first and second column operators YOP1 and YOP2 illustrated in FIG. 1 may be disposed in the first wafer W1. The first plane 110-1, the first row driver XDR1 and the first column driver YDR1 may be disposed in the second wafer W2. The second plane 110-2, the second row driver XDR2 and the second column driver YDR2 may be disposed in the third wafer W3.

In the second wafer W2, a plurality of word lines WL may extend in the second direction SD and may be arranged in the first direction FD. In the second wafer W2, a plurality of bit lines BL may extend in the first direction FD and may be arranged in the second direction SD. As described above with reference to FIG. 1, the first row driver XDR1 may be coupled to the plurality of word lines WL that are arranged in the first plane 110-1, and the first column driver YDR1 may be coupled to the plurality of bit lines BL that are arranged in the first plane 110-1.

The first row driver XDR1 may include a plurality of circuits, for example, a plurality of pass transistors repeatedly and respectively disposed adjacent to the plurality of word lines WL and arranged in the first plane 110-1. The first row driver XDR1 may be disposed adjacent to the first plane 110-1 in the second direction SD, and may be disposed to have a shape extending in the first direction FD, which is also the direction in which the word lines WL are arranged.

The first column driver YDR1 may include a plurality of circuits, for example, a plurality of bit line select transistors repeatedly and respectively disposed adjacent to the plurality of bit lines BL and arranged in the first plane 110-1. The first column driver YDR1 may be disposed adjacent to the first plane 110-1 in the first direction FD, and may be disposed to have a shape extending in the second direction SD as a direction in which the bit lines BL are arranged. The present embodiment illustrates the first column driver YDR1 divided in the first direction FD by the first plane 110-1, but embodiments contemplated by the disclosure are not limited thereto. The first column driver YDR1 may be disposed on only one side of the first plane 110-1 in the first direction FD.

In the third wafer W3, a plurality of word lines WL may extend in the second direction SD and may be arranged in the first direction FD. A plurality of bit lines BL may extend in the first direction FD and may be arranged in the second direction SD. As described above with reference to FIG. 1, the second row driver XDR2 may be coupled to the plurality of word lines WL, which are arranged in the second plane 110-2, and the second column driver YDR2 may be coupled to the plurality of bit lines BL, which are arranged in the second plane 110-2.

The second row driver XDR2 may be disposed adjacent to the second plane 110-2 in the second direction SD, and may be disposed to have a shape extending in the first direction FD as a direction in which the word lines WL are arranged. The second column driver YDR2 may be disposed adjacent to the second plane 110-2 in the first direction FD, and may be disposed to have a shape extending in the second direction SD as a direction in which the bit lines BL of the second plane 110-2 are arranged.

The second plane 110-2 may overlap with the first plane 110-1 in the vertical direction VD. The occupation area of the second plane 110-2 in the first direction FD and the second direction SD may be substantially the same as the occupation area of the first plane 110-1. The second row driver XDR2 may overlap with the first row driver XDR1 in the vertical direction VD. The occupation area of the second row driver XDR2 may be substantially the same as the occupation area of the first row driver XDR1 in the first direction FD and the second direction SD. The second column driver YDR2 may overlap with the first column driver YDR1 in the vertical direction VD. The occupation area of the second column driver YDR2 may be substantially the same as the occupation area of the first column driver YDR1 in the first direction FD and the second direction SD.

The first wafer W1 may include a cell region CR and a peripheral region PR. The cell region CR may be defined as a region that overlaps with the first plane 110-1 and the second plane 110-2 in the vertical direction VD. The area of the cell region CR may correspond to the occupation area of the first plane 110-1 or the occupation area of the second plane 110-2. The peripheral region PR may be defined as a region that does not overlap with the first plane 110-1 and the second plane 110-2.

The first column operator YOP1 and the second column operator YOP2 may be disposed in the cell region CR. Accordingly, the first column operator YOP1 and the second column operator YOP2 may overlap with the first plane 110-1 and the second plane 110-2 in the vertical direction VD. The first column operator YOP1 and the second column operator YOP2 have shapes that extend in the second direction SD, and may be disposed side by side with or adjacent to each other.

The first and second row operators XOP1 and XOP2 may be disposed in the peripheral region PR. The first and second row operators XOP1 and XOP2 may be disposed adjacent to the first and second column operators YOP1 and YOP2 in the second direction SD. The first and second row operators XOP1 and XOP2 may overlap with the first row driver XDR1 and the second row driver XDR2 in the vertical direction VD.

Although not illustrated, a peripheral circuit (see 140 of FIG. 1) may be disposed, in the peripheral region PR of the first wafer W1, in a region where the first and second row operators XOP1 and XOP2 are not disposed. The peripheral circuit may include a voltage generator, an input/output buffer, a temperature sensor, a pre-decoder, a command decoder, an address decoder, a test circuit, and so on.

Figure 5:
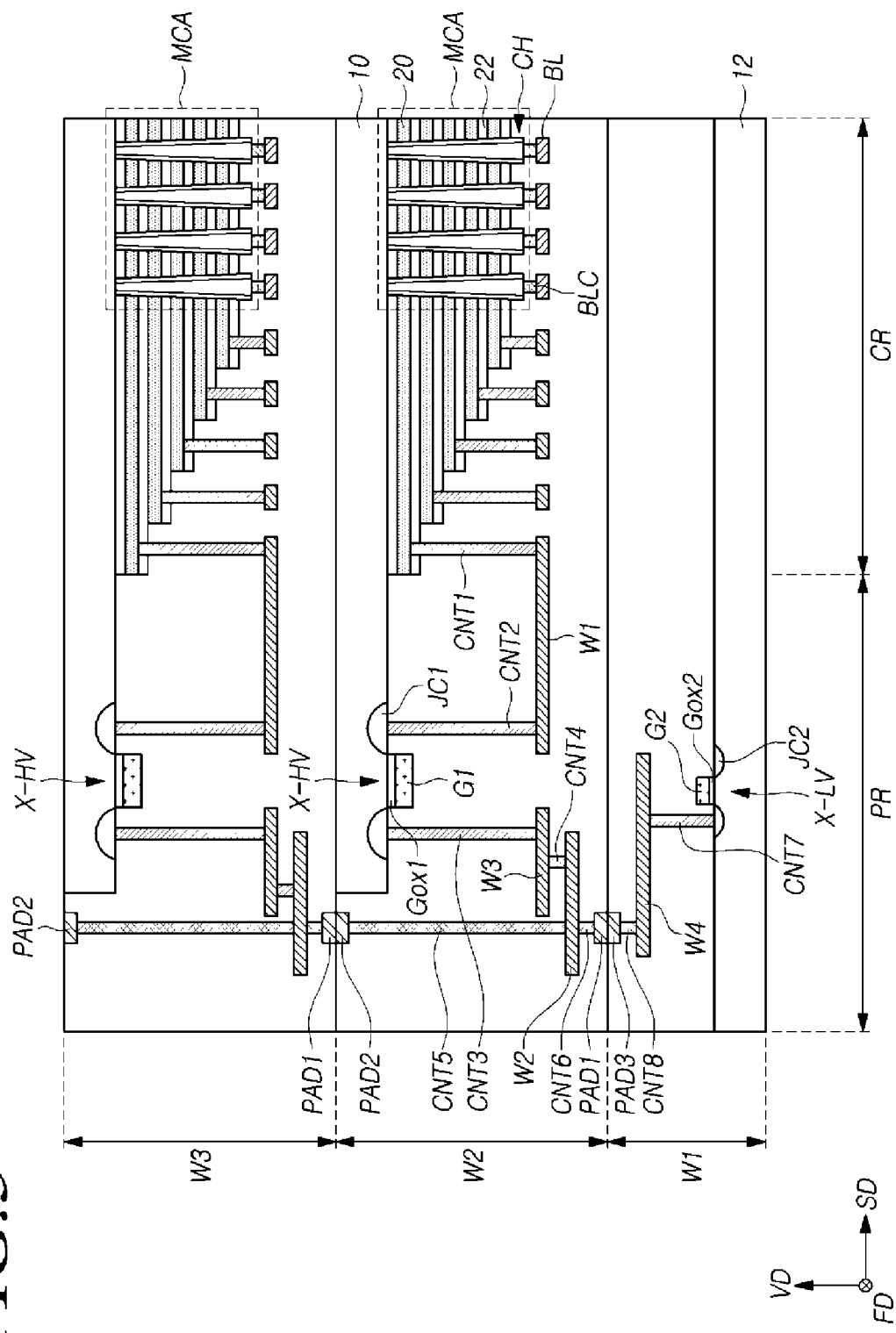
FIGS. 5 and 6 are exemplary cross-sectional views illustrating a representation of a memory device in accordance with embodiments of the disclosure.

FIG. 5 is an exemplary cross-sectional view illustrating a representation of a memory device in accordance with an embodiment of the disclosure, and corresponding to a cross-section, as viewed in the first direction FD and taken in the extending direction of word lines.

Referring to FIGS. 4 and 5, a second wafer W2 may include a first substrate 10, a memory cell array MCA and a first transistor X-HV, which are defined on the first substrate 10. The memory cell array MCA may be disposed in a cell region CR of the first substrate 10, and the first transistor X-HV may be disposed in a peripheral region PR of the first substrate 10.

The memory cell array MCA may include a plurality of vertical channels CH that project from the first substrate 10 in the vertical direction VD, and a plurality of electrode layers 20 and a plurality of interlayer dielectric layers 22, which are alternately stacked along the vertical channels CH. The electrode layers 20 may include a conductive material. For example, the electrode layers 20 may include at least one selected from among a doped semiconductor (e.g., doped silicon), a metal (e.g., tungsten, copper or aluminum), conductive metal nitride (e.g., titanium nitride or tantalum nitride) and a transition metal (e.g., titanium or tantalum). The interlayer dielectric layers 22 may include silicon oxide. At least one electrode layer 20 from the lowermost electrode layer 20 among the electrode layers 20 may configure a source select line. At least one electrode layer 20 from the uppermost electrode layer 20 among the electrode layers 20 may configure a drain select line. The electrode layers 20 between the source select line and the drain select line may configure word lines.

While not illustrated in detail, each of the vertical channels CH may include a channel layer and a gate dielectric layer. The channel layer may include polysilicon or monocrystalline silicon, and may include, in some regions thereof, a P-type impurity such as boron (B). The gate dielectric layer may have the shape of a straw or a cylindrical shell that surrounds the outer wall of the channel layer. The gate dielectric layer may include a tunnel dielectric layer, a charge storage layer and a blocking layer, which are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked. Source select transistors may be configured in areas or regions in which the source select line surrounds the vertical channels CH. Memory cells may be configured in areas or regions in which the word lines surround the vertical channels CH. Drain select transistors may be configured in areas or regions in which the drain select line surrounds the vertical channels CH. The drain select transistor, the plurality of memory cells and the source select transistor disposed along one vertical channel CH may configure one cell string.

A plurality of bit lines BL may be disposed over the vertical channels CH, the electrode layers 20 and the interlayer dielectric layers 22. Bit line contacts BLC may be defined between the bit lines BL and the vertical channels CH to couple the bit lines BL and the vertical channels CH.

The first transistor X-HV may include a gate electrode G1, which is defined on the first substrate 10 with a gate dielectric layer Gox1 interposed therebetween, and junction regions JC1, which are defined in the first substrate 10 on both sides of the gate electrode G1. One of the junction regions JC1 may be used as a source region of the first transistor X-HV, and the other of the junction regions JC1 may be used as a drain region of the first transistor X-HV. One of the junction regions JC1 of the first transistor X-HV may be coupled to one of the electrode layers 20 through contacts CNT1 and CNT2 and a wiring line W1.

A first pad PAD1 may be defined on one surface of the second wafer W2, and a second pad PAD2 may be defined on the other surface of the second wafer W2 that faces away from the one surface. The other of the junction regions JC1 of the first transistor X-HV may be coupled to the first pad PAD1 and the second pad PAD2 through contacts CNT3 to CNT6 and wiring lines W2 and W3. The third wafer W3 may have substantially the same structure as the second wafer W2.

The memory cell array MCA of the second wafer W2 may configure the first plane 110-1 of FIG. 4, and the memory cell array MCA of the third wafer W3 may configure the second plane 110-2 of FIG. 4. The first transistor X-HV of the second wafer W2 may configure the first row driver XDR1 of FIG. 4, and the first transistor X-HV of the third wafer W3 may configure the second row driver XDR2 of FIG. 4.

The first wafer W1 may include a second substrate 12 and a second transistor X-LV, which is defined on the second substrate 12. The second transistor X-LV may be disposed in the peripheral region PR of the second substrate 12. The second transistor X-LV may include a gate electrode G2 that is defined on the second substrate 12, with a gate dielectric layer Gox2 interposed therebetween, and junction regions JC2, which are defined in the second substrate 12 on both sides of the gate electrode G2.

The second transistor X-LV may configure the first row operator XOP1 or the second row operator XOP2 of FIG. 4. One of the junction regions JC2 of the second transistor X-LV may be coupled to a third pad PAD3, which is defined on one side of the first wafer W1, through contacts CNT7 and CNT8 and a wiring line W4. The second wafer W2 may be stacked on the first wafer W1 such that the first pad PAD1 of the second wafer W2 is bonded to the third pad PAD3 of the first wafer W1. The third wafer W3 may be stacked on the second wafer W2 such that the first pad PAD1 of the third wafer W3 is bonded to the second pad PAD2 of the second wafer W2. Accordingly, an electrical path couples the second transistor X-LV of the first wafer W1, the first transistor X-HV of the second wafer W2 and the first transistor X-HV of the third wafer W3.

Signals may be individually provided to the gate electrode G1 of the first transistor X-HV of the second wafer W2 and to the gate electrode G1 of the first transistor X-HV of the third wafer W3. Therefore, the first transistor X-HV of the second wafer W2 and the first transistor X-HV of the third wafer W3 may be individually turned on or off.

The first transistor X-HV of the second wafer W2 and the first transistor X-HV of the third wafer W3 may be high-voltage transistors, and the second transistor X-LV of the first wafer W1 may be a low-voltage transistor. The gate dielectric layer Gox1 of the first transistor X-HV may have a thickness larger than that of the gate dielectric layer Gox2 of the second transistor X-LV so as to withstand a high voltage.

The first transistor X-HV of the second wafer W2 and the first transistor X-HV of the third wafer W3 may overlap with each other in the vertical direction VD. The second transistor X-LV of the first wafer W1 may overlap with the first transistor X-HV of the second wafer W2 and the first transistor X-HV of the third wafer W3 in the vertical direction VD.

In FIG. 5, only one second transistor X-LV is illustrated in the first wafer W1 and only one first transistor X-HV is illustrated in each of the second and third wafers W2 and W3. It should be understood, however, that the first wafer W1 may include a plurality of second transistors X-LV and each of the second and third wafers W2 and W3 may include a plurality of first transistors X-HV.

Figure 6:
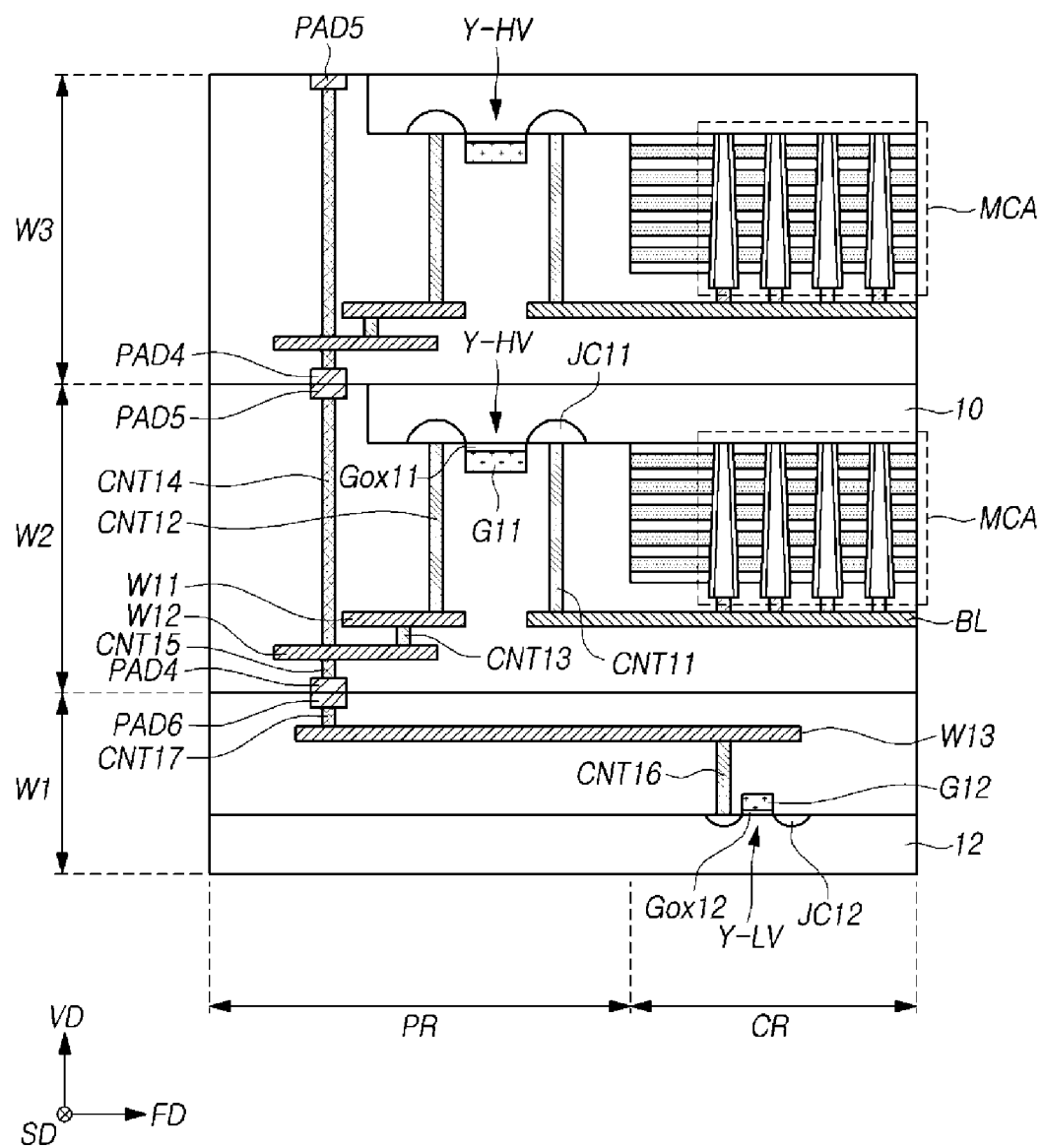

FIG. 6 is an exemplary cross-sectional view illustrating a representation of a memory device in accordance with an embodiment of the disclosure, and corresponding to a cross-section, as viewed in the second direction SD and taken in the extending direction of bit lines. Similarly identified elements in FIGS. 5 and 6 (such as memory cell array MCA, bit line BL, etc.) may be construed as having substantially the same structure, material and configuration.

Referring to FIGS. 4 and 6, a third transistor Y_HV may be disposed in the peripheral region PR of the first substrate 10 in the second wafer W2. The third transistor Y-HV may include a gate electrode G11 which is defined on the first substrate 10 with a gate dielectric layer Gox11 interposed therebetween, and junction regions JC11 that are defined in the first substrate 10 on both sides of the gate electrode G11. One of the junction regions JC11 of the third transistor Y-HV may be coupled to the bit line BL through a contact CNT11.

A fourth pad PAD4 may be defined on the one surface of the second wafer W2, and a fifth pad PAD5 may be defined on the other surface of the second wafer W2 that faces away from the one surface. The other of the junction regions JC11 of the third transistor Y-HV may be coupled to the fourth pad PAD4 and the fifth pad PAD5 through contacts CNT12 to CNT15 and wiring lines W11 and W12. The third wafer W3 may have substantially the same structure as the second wafer W2.

The third transistor Y-HV of the second wafer W2 may configure the first column driver YDR1 of FIG. 4. The third transistor Y-HV of the third wafer W3 may configure the second column driver YDR2 of FIG. 4.

In the first wafer W1, a fourth transistor Y-LV may be defined in the cell region CR of the second substrate 12. The fourth transistor Y-LV may include a gate electrode G12 that is defined on the second substrate 12, with a gate dielectric layer Gox12 interposed therebetween, and junction regions JC12 that are defined in the second substrate 12 on both sides of the gate electrode G12. The fourth transistor Y-LV may configure the first column operator YOP1 or the second column operator YOP2 of FIG. 4.

One of the junction regions JC12 of the fourth transistor Y-LV may be coupled to a sixth pad PAD6, which is defined on the one side of the first wafer W1, through contacts CNT16 and CNT17 and a wiring line W13. The second wafer W2 may be stacked on the first wafer W1 such that the fourth pad PAD4 of the second wafer W2 is bonded to the sixth pad PAD6 of the first wafer W1. The third wafer W3 may be stacked on the second wafer W2 such that the fourth pad PAD4 of the third wafer W3 is bonded to the fifth pad PAD5 of the second wafer W2. Accordingly, an electrical path couples the fourth transistor Y-LV of the first wafer W1, the third transistor Y-HV of the second wafer W2 and the third transistor Y-HV of the third wafer W3.

Signals may be individually provided to the gate electrode G11 of the third transistor Y-HV of the second wafer W2 and to the gate electrode G11 of the third transistor Y-HV of the third wafer W3. Therefore, the third transistor Y-HV of the second wafer W2 and the third transistor Y-HV of the third wafer W3 may be individually turned on or off.

The third transistor Y-HV of the second wafer W2 and the third transistor Y-HV of the third wafer W3 may be high-voltage transistors, and the fourth transistor Y-LV of the first wafer W1 may be a low-voltage transistor. The gate dielectric layer Gox11 of the third transistor Y-HV may have a thickness larger than that of the gate dielectric layer Gox12 of the fourth transistor Y-LV so as to withstand a high voltage. The third transistor Y-HV of the second wafer W2 and the third transistor Y-HV of the third wafer W3 may overlap with each other in the vertical direction VD. The fourth transistor Y-LV of the first wafer W1 may be disposed in the cell region CR, and may overlap with the memory cell array MCA of the second wafer W2 and the memory cell array MCA of the third wafer W3 in the vertical direction VD.

In FIG. 6, only one fourth transistor Y-LV is illustrated in the first wafer W1 and only one third transistor Y-HV is illustrated in each of the second and third wafers W2 and W3. It should be understood, however, that the first wafer W1 may include a plurality of fourth transistors Y-LV and each of the second and third wafers W2 and W3 may include a plurality of third transistors Y-HV.

Figure 7:
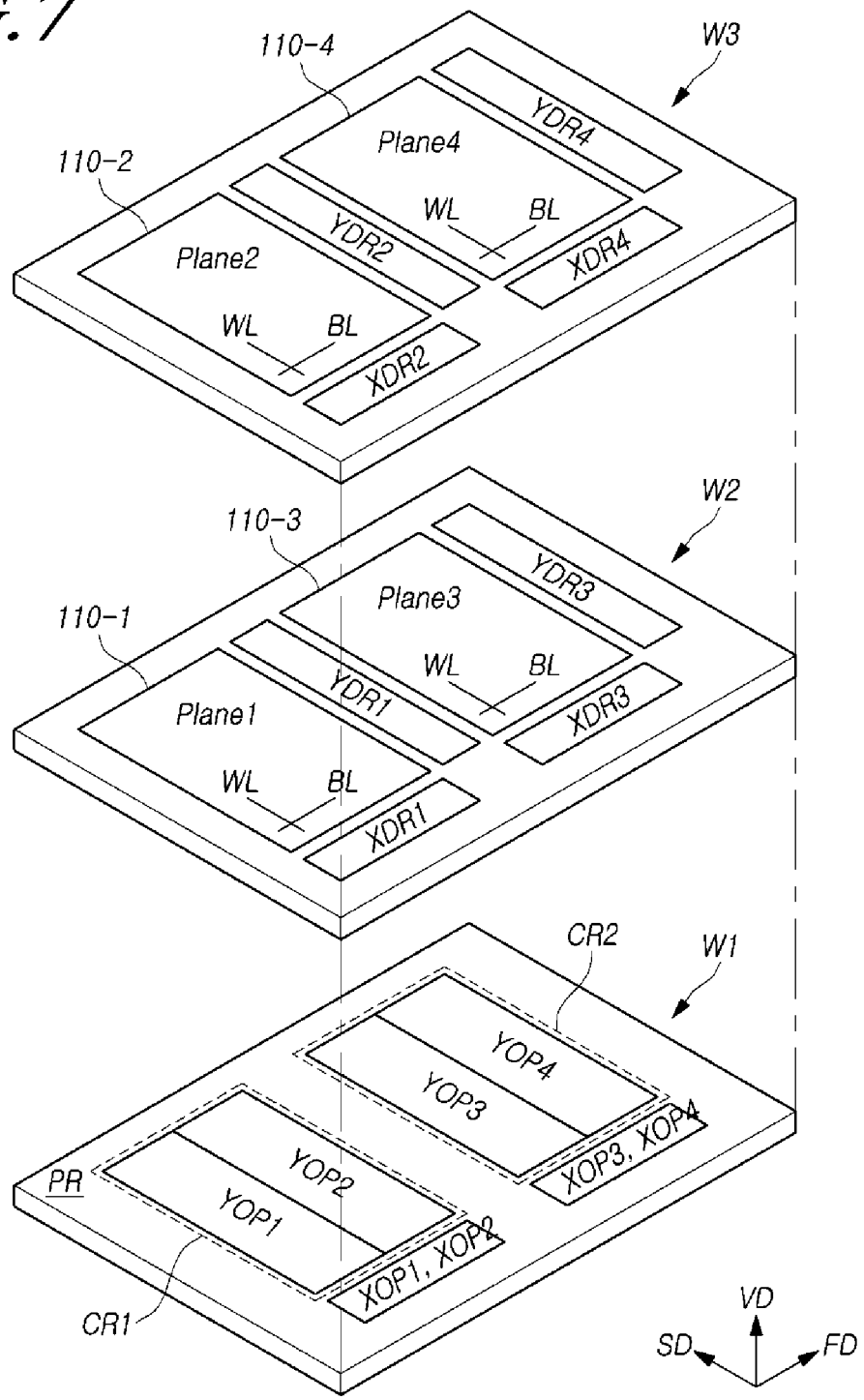
FIGS. 7 to 10 are diagrams schematically illustrating representations of examples of the layouts of memory devices in accordance with embodiments of the disclosure.

FIG. 7 is a diagram schematically illustrating a representation of a layout of a memory device in accordance with an embodiment of the disclosure.

Referring to FIG. 7, a plurality of planes may be disposed in each of a second wafer W2 and a third wafer W3. For instance, a first plane 110-1 and a third plane 110-3 may be disposed in the second wafer W2, and a second plane 110-2 and a fourth plane 110-4 may be disposed in the third wafer W3.

The first plane 110-1 of the second wafer W2 and the second plane 110-2 of the third wafer W3 may overlap with each other in the vertical direction VD. The third plane 110-3 of the second wafer W2 and the fourth plane 110-4 of the third wafer W3 may overlap with each other in the vertical direction VD.

A plurality of row drivers and a plurality of column drivers corresponding to the plurality of planes may be disposed in each of the second wafer W2 and the third wafer W3. For instance, first and third row drivers XDR1 and XDR3 and first and third column drivers YDR1 and YDR3 corresponding to the first and third planes 110-1 and 110-3 may be disposed in the second wafer W2, and second and fourth row drivers XDR2 and XDR4 and second and fourth column drivers YDR2 and YDR4 corresponding to the second and fourth planes 110-2 and 110-4 may be disposed in the third wafer W3.

Each of the row drivers XDR1 to XDR4 may be disposed, adjacent to a corresponding plane, in the second direction SD, and may be disposed to have a shape extending in the first direction FD. Each of the column drivers YDR1 to YDR4 may be disposed, adjacent to a corresponding plane, in the first direction FD, and may be disposed to have a shape extending in the second direction SD.

The first row driver XDR1 and the second row driver XDR2 may overlap with each other in the vertical direction VD, and the occupation area in the first direction FD and the second direction SD of the first row driver XDR1 and the occupation area of the second row driver XDR2 may be substantially the same as each other. The third row driver XDR3 and the fourth row driver XDR4 may overlap with each other in the vertical direction VD, and the occupation area in the first direction FD and the second direction SD of the third row driver XDR3 and the occupation area of the fourth row driver XDR4 may be substantially the same as each other. The first column driver YDR1 and the second column driver YDR2 may overlap with each other in the vertical direction VD, and the occupation area in the first direction FD and the second direction SD of the first column driver YDR1 and the occupation area of the second column driver YDR2 may be substantially the same as each other. The third column driver YDR3 and the fourth column driver YDR4 may overlap with each other in the vertical direction VD, and the occupation area in the first direction FD and the second direction SD of the third column driver YDR3 and the occupation area of the fourth column driver YDR4 may be substantially the same as each other.

A plurality of row operators and a plurality of column operators corresponding to the plurality of planes 110-1 to 110-4 may be disposed in a first wafer W1. For instance, first to fourth row operators XOP1 to XOP4 and first to fourth column operators YOP1 to YOP4 may be disposed in the first wafer W1.

The first wafer W1 may include a plurality of cell regions CR1 and CR2 and a peripheral region PR. The first cell region CR1 may be defined as a region that overlaps with the first plane 110-1 and the second plane 110-2 in the vertical direction VD. The second cell region CR2 may be defined as a region that overlaps with the third plane 110-3 and the fourth plane 110-4 in the vertical direction VD. The peripheral region PR may be defined as a region that does not overlap with the first to fourth planes 110-1 to 110-4.

The first column operator YOP1 and the second column operator YOP2 may be disposed in the first cell region CR1 of the first wafer W1, and the third column operator YOP3 and the fourth column operator YOP4 may be disposed in the second cell region CR2 of the first wafer W1. Each of the column operators YOP1 to YOP4 may overlap with a corresponding plane in the vertical direction VD. The first to fourth column operators YOP1 to YOP4 may be disposed to have shapes extending in the second direction SD, and may be disposed side by side with or adjacent to each other.

The first to fourth row operators XOP1 to XOP4 may be disposed in the peripheral region PR. The first and second row operators XOP1 and XOP2 may be disposed in the peripheral region PR adjacent to the first cell region CR1 in the second direction SD, and the third and fourth row operators XOP3 and XOP4 may be disposed in the peripheral region PR adjacent to the second cell region CR2 in the second direction SD. The first and second row operators XOP1 and XOP2 may overlap with the first row driver XDR1 and the second row driver XDR2 in the vertical direction VD. The third and fourth row operators XOP3 and XOP4 may overlap with the third row driver XDR3 and the fourth row driver XDR4 in the vertical direction VD.

Although not illustrated, a peripheral circuit (see 140 of FIG. 1) may be disposed in a region in which the first to fourth row operators XOP1 to XOP4 are not disposed, such as in the peripheral region PR of the first wafer W1. The peripheral circuit may include a voltage generator, an input/output buffer, a temperature sensor, a pre-decoder, a command decoder, an address decoder, a test circuit, and so on.

Figure 8:
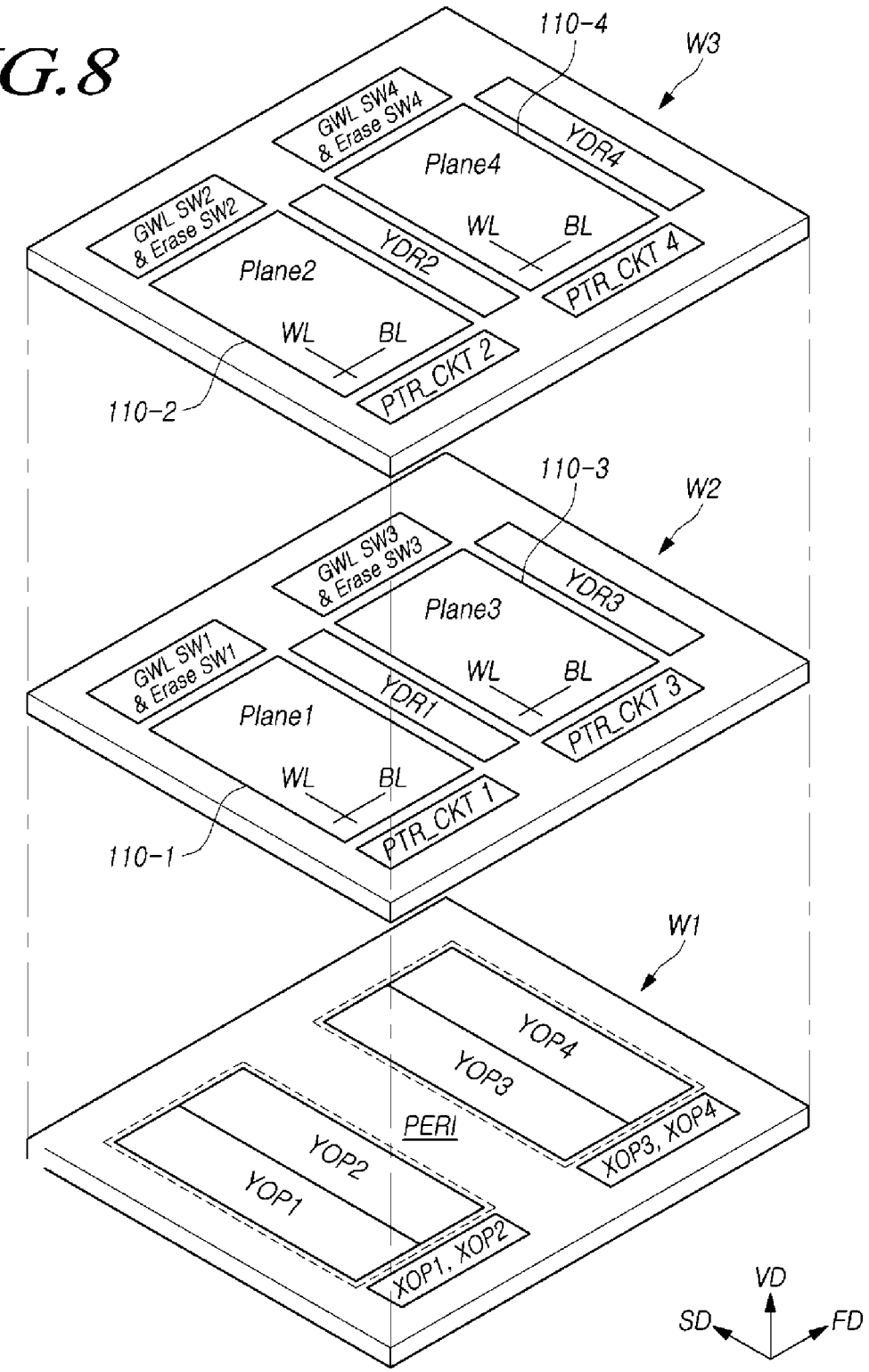

FIG. 8 is a diagram schematically illustrating a representation of a layout of another memory device in accordance with an embodiment of the disclosure.

Referring to FIG. 8, a pass transistor circuit PTR_CKT and a global line switch circuit GWL SW, which configure a row driver, may be separated and be disposed on both sides, respectively, of a corresponding plane in the second direction SD. For instance, a pass transistor circuit PTR_CKT1 and a global line switch circuit GWL SW1, which configure a first row driver, may be divided and be disposed on both sides, respectively, of a first plane 110-1 in the second direction SD.

The pass transistor circuit PTR_CKT may include circuits For example, pass transistor circuits may be repeatedly and respectively disposed adjacent to a plurality of word lines WL and arranged in the corresponding plane. The length of the pass transistor circuit PTR_CKT in the first direction FD may be substantially the same as the length of the corresponding plane in the first direction FD. Such disposition of the pass transistor circuits PTR_CKT may reduce a time required to transfer an operating voltage from a pass transistor circuit PTR_CKT to a corresponding plane.

The memory device may include a plurality of erase bias switching circuits Erase SW that correspond to the planes 110-1 to 110-4, respectively. Each erase bias switching circuit Erase SW may be coupled to a common source line and/or bit lines of a corresponding plane, and may transfer an erase voltage to the corresponding plane through the common source line and/or the bit lines in an erase operation. Transistors included in the erase bias switching circuits Erase SW may be configured by high-voltage transistors to withstand a high erase voltage. Each erase bias switching circuit Erase SW may be disposed, together with the global line switch circuit GWL SW, on one side of a corresponding plane in the second direction SD.

Figure 9:
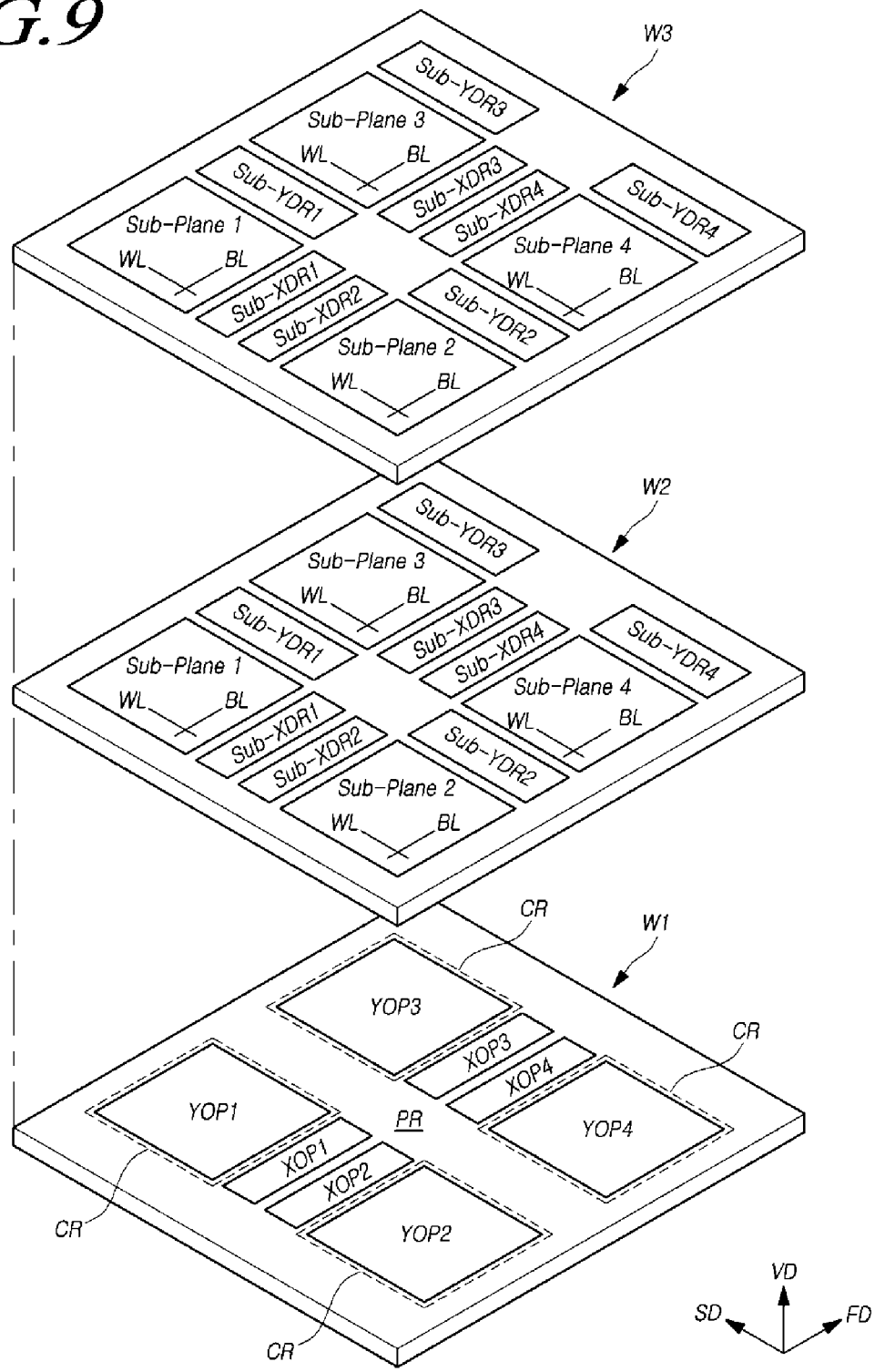

FIG. 9 is a diagram schematically illustrating a representation of a layout of still another memory device in accordance with an embodiment of the disclosure.

Referring to FIG. 9, a plane may be divided into two sub planes Sub-Plane and be disposed partially in a second wafer W2 and partially in a third wafer W3. For instance, a first plane may be divided into two sub planes Sub-Plane 1, with one sub plane disposed in each of the second wafer W2 and the third wafer W3. Sub planes Sub-Plane included in a single plane may overlap with each other in the vertical direction VD.

In a case in which the memory device includes four planes, four sub planes Sub-Plane 1 to Sub-Plane 4 may be disposed in each of the second wafer W2 and the third wafer W3Sub plane 1 to Sub-Plane 4 may be disposed in the form of a matrix in the first direction FD and the second direction SD in each of the second wafer W2 and the third wafer W3.

A plurality of sub row drivers Sub-XDR and a plurality of sub column drivers Sub-YDR may be disposed in each of the second wafer W2 and the third wafer W3, in each case corresponding to the plurality of sub planes Sub-Plane in the wafer. Each sub row driver Sub-XDR may be coupled to word lines WL that are arranged in a corresponding sub plane Sub-Plane. Each sub row driver Sub-XDR may be disposed adjacent to the corresponding sub plane Sub-Plane in the second direction SD, and may be disposed to have a shape extending in the first direction FD. Each sub column driver Sub-YDR may be coupled to bit lines BL that are arranged in the corresponding sub plane Sub-Plane. Each sub column driver Sub-YDR may be disposed adjacent to the corresponding sub plane Sub-Plane in the first direction FD, and may be disposed to have a shape extending in the second direction SD.

A pair of sub row drivers Sub-XDR, which are coupled to a pair of sub planes Sub-Plane that together configure one plane, may overlap with each other in the vertical direction VD. The occupation areas of the pair of sub row drivers Sub-XDR may be substantially the same as each other. For instance, a first sub row driver Sub-XDR1 of the second wafer W2 and a first sub row driver Sub-XDR1 of the third wafer W3 may overlap with each other in the vertical direction VD, and the occupation area of the first sub row driver Sub-XDR1 of the second wafer W2 and the occupation area of the first sub row driver Sub-XDR1 of the third wafer W3 may be substantially the same.

A pair of sub column drivers Sub-YDR, which are coupled to a pair of sub planes Sub-Plane that together configure one plane, may overlap with each other in the vertical direction VD. The occupation areas of the pair of sub column drivers Sub-YDR may be substantially the same as each other. For instance, a first sub column driver Sub-YDR1 of the second wafer W2 and a first sub column driver Sub-YDR1 of the third wafer W3 may overlap with each other in the vertical direction VD, and the occupation area of the first sub column driver Sub-YDR1 of the second wafer W2 and the occupation area of the first sub column driver Sub-YDR1 of the third wafer W3 may be substantially the same.

A plurality of row operators and a plurality of column operators corresponding to the plurality of planes may be disposed in a first wafer W1. For instance, first to fourth row operators XOP1 to XOP4 and first to fourth column operators YOP1 to YOP4 may be disposed in the first wafer W1. As an example, a plane may be configured by a pair of sub planes Sub-Plane disposed in different wafer and spaced apart in the vertical direction VD. Each row operator XOP may correspond to one pair of sub planes Sub-Plane disposed in the vertical direction VD, and each column operator YOP may correspond to one pair of sub planes Sub-Plane disposed in the vertical direction VD.

The first wafer W1 may include a plurality of cell regions CR and a peripheral region PR. The respective cell regions CR may be defined as regions that overlap with sub planes in the vertical direction VD. The area of each cell region CR may correspond to the occupation area of each sub plane in the first direction FD and the second direction SD. The peripheral region PR may be defined as a region that does not overlap with the sub planes.

Each column operator YOP may be disposed in each cell region CR of the first wafer W1 that overlaps with a pair of corresponding sub planes Sub-Plane. Each column operator YOP may overlap with the pair of corresponding sub planes Sub-Plane in the vertical direction VD.

The row operators XOP may be disposed in the peripheral region PR. Each row operator YOP may be disposed in the peripheral region PR adjacent to each cell region CR of the first wafer W1 that overlaps with a pair of corresponding sub planes Sub-Plane. Each row operator XOP may also overlap with the sub row drivers Sub-XDR corresponding to the sub planes in the vertical direction VD.

Although not illustrated, a peripheral circuit (see 140 of FIG. 1) may be disposed, in the peripheral region PR of the first wafer W1, in a region where the row operators XOP are not disposed. The peripheral circuit may include a voltage generator, an input/output buffer, a temperature sensor, a pre-decoder, a command decoder, an address decoder, a test circuit, and so on.

Figure 10:
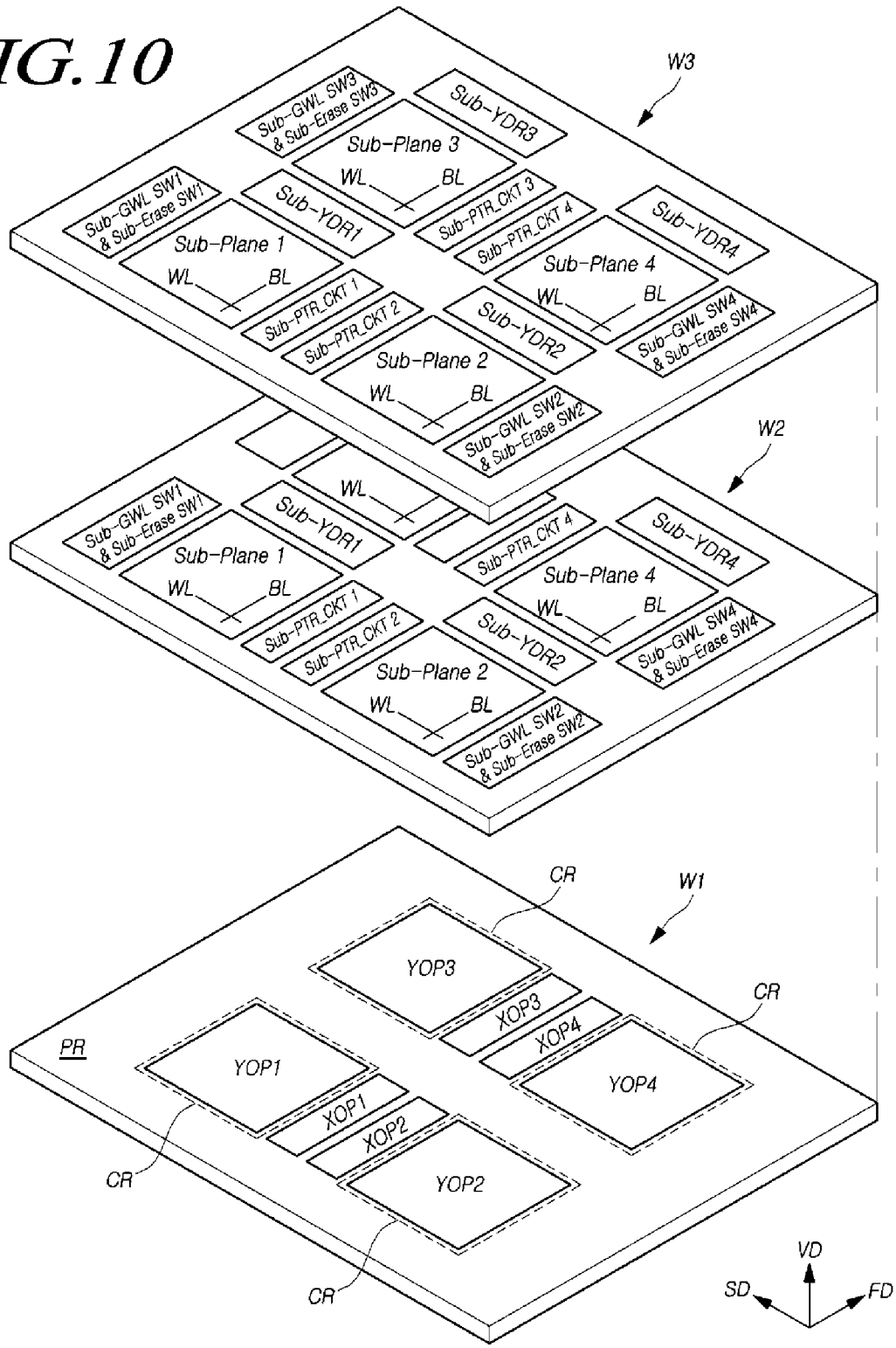

FIG. 10 is a diagram schematically illustrating a representation of a layout of yet another memory device in accordance with an embodiment of the disclosure.

Referring to FIG. 10, a sub row driver includes a sub pass transistor circuit Sub-PTR_CKT and a sub global line switch circuit Sub-GWL SW, which, may be separated and be disposed on both sides, respectively, of a corresponding sub plane Sub-Plane in the second direction SD.

The sub pass transistor circuit Sub-PTR_CKT may include circuits, such as for example, pass transistor circuits that are repeatedly and respectively disposed adjacent to a plurality of word lines WL that are arranged in the corresponding sub plane Sub-Plane. The length of the sub pass transistor circuit Sub-PTR_CKT in the first direction FD may be substantially the same as the length of the corresponding sub plane Sub-Plane in the first direction FD.

The memory device may include a plurality of sub erase bias switching circuits Sub-Erase SW corresponding to a plurality of sub planes Sub-Plane. Each sub erase bias switching circuit Sub-Erase SW may be coupled to a common source line and/or bit lines of a corresponding sub plane Sub-Plane, and may transfer an erase voltage to the corresponding sub plane Sub-Plane through the common source line and/or the bit lines in an erase operation. Transistors included in the sub erase bias switching circuits Sub-Erase SW may be configured by high-voltage transistors to withstand a high erase voltage. Each sub erase bias switching circuit Sub-Erase SW may be disposed together with the sub global line switch circuit Sub-GWL SW on one side of the corresponding sub plane Sub-Plane in the second direction SD.

Hereunder, effects according to the embodiments of the disclosure will be described.

As process refinements and a three-dimensional stack structure are utilized, there is a growing trend toward a decrease in the size of a plane. On the other hand, the size of a logic circuit that controls the operation of the plane is remains the same, or rather increases due to increases in the number of row decoders and the number of page buffer circuits, which are attributable to an increase in the number of planes. For this reason, while the degree of integration of a memory device is increasing, it is still limited. According to embodiments of the disclosure, some circuits that configure a logic circuit may be disposed in the same wafer as a plane, and the remaining circuits may be disposed to overlap with the plane and the some circuits in a vertical direction. Therefore, it is possible to reduce a layout area occupied by the logic circuit, thereby contributing to the improvement in the degree of integration of the memory device.

Meanwhile, the logic circuit includes circuits that operate under different voltage conditions. For instance, a high voltage, which is higher than a power supply voltage, may be applied to a row driver (XDR), a column driver (YDR) and an erase bias switching circuit (Erase SW), and a low voltage may be applied to other circuits that require a high-speed operation, for example, a row operator (XOP), a column operator (YOP) and a peripheral circuit. A high-voltage transistor included in a circuit to which the high voltage is applied and a low-voltage transistor included in a circuit to which the low voltage is applied may have a structural difference due to a difference in the operating voltage ranges thereof. For example, the high-voltage transistor and the low-voltage transistor may require gate dielectric layers of different thicknesses.

As a method for forming transistors having different thicknesses of gate dielectric layers in one wafer, a method may be employed in which a thick gate dielectric layer is formed in a low-voltage region and a high-voltage region, then the thick gate dielectric layer formed in the low-voltage region is removed and a thin gate dielectric layer additionally formed in a low-voltage transistor. In order to remove the thick gate dielectric layer of the low-voltage region while leaving the thick gate dielectric layer in the high-voltage region, a process of forming a mask pattern covering the high-voltage region and exposing the low-voltage region, an etching process for removing the thick gate dielectric layer formed in the low-voltage region, and a strip process of removing the mask pattern remaining after etching may be required.

According to embodiments of the disclosure, transistors included in a logic circuit are divided into high-voltage transistors and low-voltage transistors, the high-voltage transistors are disposed in the same wafer as a plane, and the low-voltage transistors are disposed in a wafer separate from the wafer in which the plane and the high-voltage transistors are disposed. Therefore, since it is possible to omit the manufacturing step of removing the thick gate dielectric layer of a low-voltage region that is required in the case where high-voltage transistors and low-voltage transistors are fabricated on a single wafer, manufacturing time and cost may be reduced, and a manufacturing process may be simplified to suppress or reduce the occurrence of a defect during the manufacturing process.

Figure 11:
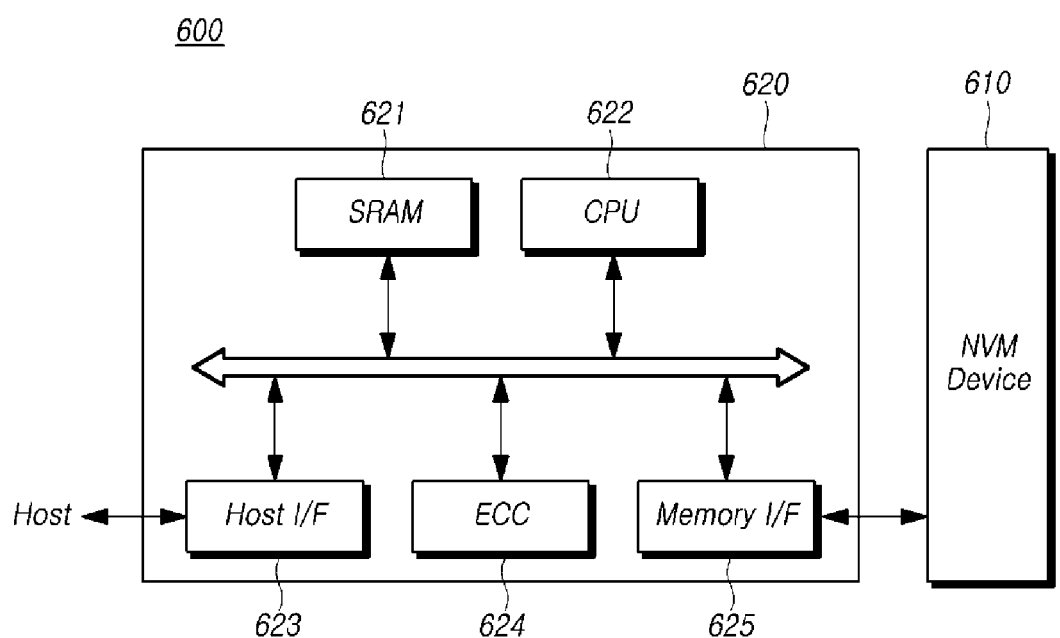
FIG. 11 is a block diagram schematically illustrating a memory system including a memory device in accordance with embodiments of the disclosure.

FIG. 11 is a block diagram schematically illustrating a memory system including a memory device in accordance with embodiments of the disclosure.

Referring to FIG. 11, a memory system 600 in accordance with an embodiment may include a nonvolatile memory device (NVM Device) 610 and a memory controller 620.

The nonvolatile memory device (NVM Device) 610 may be constituted by a memory device described above and may operate in the manner described above. The memory controller 620 may be configured to control the nonvolatile memory device (NVM Device) 610. The combination of the nonvolatile memory device (NVM Device) 610 and the memory controller 620 may be configured as a memory card or a solid state disk (SSD). An SRAM 621 is used as a working memory of a processing unit (CPU) 622. A host interface (Host I/F) 623 includes a data exchange protocol of a host which is coupled with the memory system 600.

An error correction code block (ECC) 624 detects and corrects an error included in data read from the nonvolatile memory device 610.

A memory interface (MEMORY I/F) 625 interfaces with the nonvolatile memory device (NVM Device) 610 of the present embodiment. The processing unit (CPU) 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device (NVM Device) 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Drive Electronics) protocol.

Figure 12:
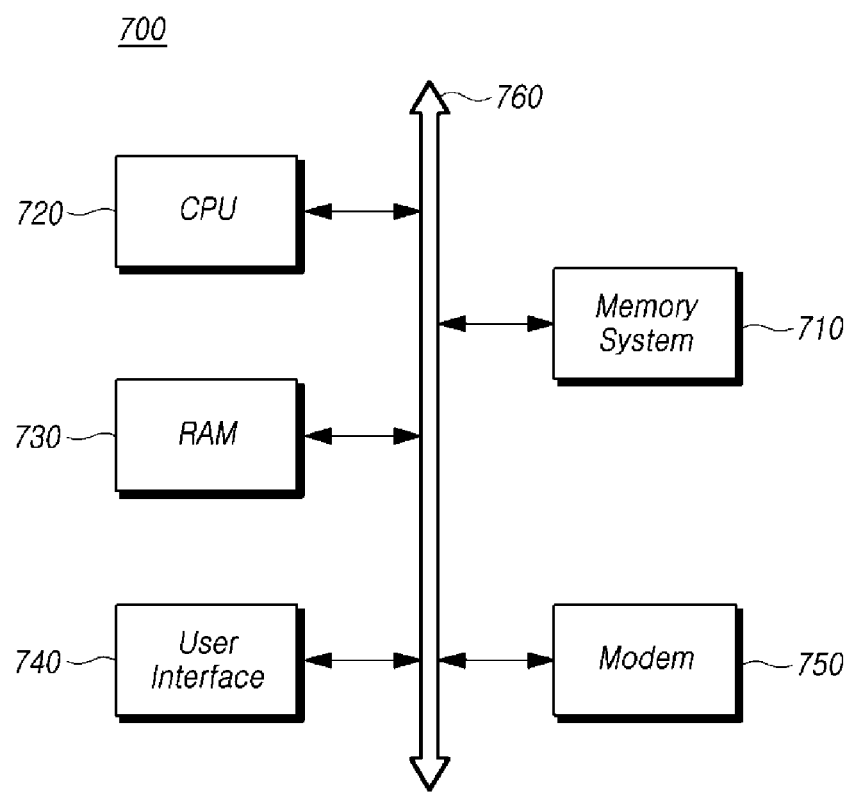
FIG. 12 is a block diagram schematically illustrating a computing system including a memory device in accordance with embodiments of the disclosure.

FIG. 12 is a block diagram schematically illustrating a computing system including a memory device in accordance with embodiments of the disclosure.

Referring to FIG. 12, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure may be interpreted in connection with the appended claims and encompass all equivalents falling within the scope of the appended claims.

What is claimed is:

1. A memory device comprising:
    a first plane including a plurality of memory cells that are defined in a second wafer stacked on a first wafer;

a second plane including a plurality of memory cells that are defined in a third wafer stacked on the second wafer, and overlapping with the first plane in a vertical direction;

a first page buffer circuit including a first column driver, which is coupled to bit lines of the first plane, and a first column operator that is coupled to the first column driver; and a second page buffer circuit including a second column driver, which is coupled to bit lines of the second plane, and a second column operator that is coupled to the second column driver, wherein the first column driver is disposed in the second wafer, the second column driver is disposed in the third wafer and overlaps with the first column driver in the vertical direction, and the first and second column operators are disposed in a cell region of the first wafer and overlap with the first and second planes in the vertical direction.

2. The memory device according to claim 1, wherein the first column driver is disposed adjacent to the first plane, and is disposed to have a shape extending in a direction in which the bit lines of the first plane are arranged, and wherein the second column driver is disposed adjacent to the second plane, and is disposed to have a shape extending in a direction in which the bit lines of the second plane are arranged.

3. The memory device according to claim 1, wherein the first and second column operators are disposed to have shapes extending in the directions in which the bit lines of the first and second planes are arranged.

4. The memory device according to claim 1, further comprising:

a first row decoder including a first row driver, which is coupled to word lines of the first plane, and a first row operator that is coupled to the first row driver; and a second row decoder including a second row driver, which is coupled to word lines of the second plane, and a second row operator that is coupled to the second row driver, wherein the first row driver is disposed in the second wafer, the second row driver is disposed in the third wafer, and the first and second row operators are disposed in the first wafer, wherein the first row driver and the second row driver overlap with each other in the vertical direction, and wherein the first and second row operators overlap with the first and second row drivers in the vertical direction.

5. The memory device according to claim 4, wherein the first row driver is disposed adjacent to the first plane, and is disposed to have a shape extending in a direction in which the word lines of the first plane are arranged, and wherein the second row driver is disposed adjacent to the second plane, and is disposed to have a shape extending in a direction in which the word lines of the second plane are arranged.

6. The memory device according to claim 4, wherein the first row driver comprises a first pass transistor circuit that is coupled to the word lines of the first plane, and a first global line switch circuit that is coupled to the first pass transistor circuit through global word lines of the first plane, and wherein the second row driver comprises a second pass transistor circuit that is coupled to the word lines of the second plane, and a second global line switch circuit that is coupled to the second pass transistor circuit through global word lines of the second plane.

7. The memory device according to claim 6, wherein the first pass transistor circuit and the first global line is switch circuit are separated and are disposed on both sides, respectively, of the first plane in a direction in which the word lines of the first plane extend, and wherein the second pass transistor circuit and the second global line switch circuit are separated and are disposed on both sides, respectively, of the second plane in a direction in which the word lines of the second plane extend.

8. The memory device according to claim 1, further comprising:

a first erase bias switching circuit configured to transfer an erase voltage to the first plane; and a second erase bias switching circuit configured to transfer an erase voltage to the second plane, wherein the first erase bias switching circuit is disposed in the second wafer, and the second erase bias switching circuit is disposed in the third wafer.

9. A memory device comprising:

a plane including a first sub plane that is defined in a second wafer stacked on a first wafer, and a second sub plane that is defined in a third wafer stacked on the second wafer; and a page buffer circuit including a first sub column driver that is coupled to bit lines of the first sub plane, a second sub column driver that is coupled to bit lines of the second sub plane, and a column operator that is coupled to the first and second sub column drivers, wherein the first sub column driver is disposed in the second wafer, the second sub column driver is disposed in the third wafer and overlaps with the first sub column driver in a vertical direction, and the column operator is disposed in a cell region of the first wafer and overlaps with the first and second sub planes in the vertical direction.

10. The memory device according to claim 9, wherein the first sub column driver is disposed adjacent to the first sub plane, and has a shape extending in a direction in which the bit lines of the first sub plane are arranged, and wherein the second sub column driver is disposed adjacent to the second sub plane, and has a shape extending in a direction in which the bit lines of the second sub plane are arranged.

11. The memory device according to claim 9, further comprising:

a row decoder including a first sub row driver that is coupled to word lines of the first sub plane, a second sub row driver that is coupled to word lines of the second sub plane, and a row operator that is coupled to the first and second sub row drivers, wherein the first sub row driver is disposed in the second wafer, the second sub row driver is disposed in the third wafer, and the row operator is disposed in the first wafer, wherein the first sub row driver and the second sub row driver overlap with each other in the vertical direction, and wherein the row operator overlaps with the first and second sub row drivers in the vertical direction.

12. The memory device according to claim 11,
wherein the first sub row driver is disposed adjacent to the first sub plane, and has a shape extending in a direction in which the word lines of the first sub plane are arranged, and
wherein the second sub row driver is disposed adjacent to the second sub plane, and has a shape extending in a direction in which the word lines of the second sub plane are arranged.

13. The memory device according to claim 11,
wherein the first sub row driver comprises a first sub pass transistor circuit that is coupled to the word lines of the first sub plane, and a first sub global line switch circuit that is coupled to the first sub pass transistor circuit through global word lines of the first sub plane,
wherein the second sub row driver comprises a second sub pass transistor circuit that is coupled to the word lines of the second sub plane, and a second sub global line switch circuit that is coupled to the second sub pass transistor circuit through global word lines of the second sub plane,
wherein the first sub pass transistor circuit and the first sub global line switch circuit are separated and are disposed on both sides, respectively, of the first sub plane in a direction in which the word lines of the first sub plane extend, and
wherein the second sub pass transistor circuit and the second sub global line switch circuit are separated and are disposed on both sides, respectively, of the second sub plane in a direction in which the word lines of the second sub plane extend.

14. The memory device according to claim 9, further comprising:
a first sub erase bias switching circuit configured to transfer an erase voltage to the first sub plane; and
a second sub erase bias switching circuit configured to transfer an erase voltage to the second sub plane,
wherein the first sub erase bias switching circuit is disposed in the second wafer, and the second sub erase bias switching circuit is disposed in the third wafer.

15. A memory device comprising:
a first memory cell array disposed in a second wafer stacked on a first wafer;
a second memory cell array disposed in a third wafer stacked on the second wafer, and overlapping with the first memory cell array in a vertical direction;
a first access circuit including a first high-voltage circuit that interoperates with the first memory cell array and a first low-voltage circuit that interoperates with the first memory cell array through the first high-voltage circuit; and
a second access circuit including a second high-voltage circuit that interoperates with the second memory cell array and a second low-voltage circuit that interoperates with the second memory cell array through the second high-voltage circuit,
wherein the first high-voltage circuit is disposed in the second wafer, the second high-voltage circuit is disposed in the third wafer and overlaps with the first high-voltage circuit in the vertical direction, and the first and second low-voltage circuits are disposed in the first wafer.

16. The memory device according to claim 15,
wherein the first access circuit comprises a first page buffer circuit that is coupled to bit lines of the first memory cell array, and the second access circuit comprises a second page buffer circuit that is coupled to bit lines of the second memory cell array, and
wherein the first and second low-voltage circuits are disposed in a cell region of the first wafer that overlaps with the first and second memory cell arrays in the vertical direction.

17. The memory device according to claim 15,
wherein the first access circuit comprises a first row decoder that is coupled to word lines of the first memory cell array, and the second access circuit comprises a second row decoder that is coupled to word lines of the second memory cell array, and
wherein the first and second low-voltage circuits are disposed in a peripheral region of the first wafer that overlaps with the first and second high-voltage circuits in the vertical direction.

18. The memory device according to claim 15,
wherein each of the first, second and third wafers includes a bonding pad defined on a surface thereof to be bonded with another adjacent wafer,
wherein the bonding pad of the first wafer is coupled to the first and second low-voltage circuits through a first wiring line and a second contact in the first wafer,
wherein the bonding pad of the second wafer is coupled to the first high-voltage circuit through a second wiring line and a second contact in the second wafer,
wherein the bonding pad of the third wafer is coupled to the second high-voltage circuit through a third wiring line and a third contact in the third wafer, and
wherein each of the bonding pads of the first to third wafers is coupled to the bonding pad of another adjacent wafer.

19. A memory device comprising:
a first wafer, a second wafer and a third wafer bonded to each other in a vertical direction,
wherein the second wafer comprises a plurality of first memory cells and a first page buffer high-voltage circuit that controls the plurality of first memory cells,
wherein the third wafer comprises a plurality of second memory cells and a second page buffer high-voltage circuit that controls the plurality of second memory cells, and
wherein the first wafer comprises a page buffer low-voltage circuit that interoperates in common with the first and second page buffer high-voltage circuits and exchanges data with the plurality of first memory cells and the plurality of second memory cells through the first and second page buffer high-voltage circuits.

20. The memory device according to claim 19,
wherein the first page buffer high-voltage circuit comprises a first column driver that is coupled to the plurality of first memory cells through a plurality of first bit lines,
wherein the second page buffer high-voltage circuit comprises a second column driver that is coupled to the plurality of second memory cells through a plurality of second bit lines,
wherein the page buffer low-voltage circuit comprises a column operator that interoperates with the first column driver and the second column driver, and
wherein the first column driver and the second column driver are activated independently of each other.

* * * * *